(12) United States Patent
Luk et al.

(10) Patent No.: US 7,136,296 B2
(45) Date of Patent: Nov. 14, 2006

(54) STATIC RANDOM ACCESS MEMORY UTILIZING GATED DIODE TECHNOLOGY

(75) Inventors: Wing Kin Luk, Chappaqua, NY (US); Leland Chang, New York, NY (US)

(73) Assignee: International Business Machines Corporation, Armonk, NY (US)

(*) Notice: Subject to any disclaimer, the term of this patent is extended or adjusted under 35 U.S.C. 154(b) by 117 days.

(21) Appl. No.: 11/067,797

(22) Filed: Feb. 28, 2005

(65) Prior Publication Data

US 2006/0198181 A1    Sep. 7, 2006

(51) Int. Cl.
*G11C 11/00* (2006.01)
(52) U.S. Cl. ............................ 365/154; 365/175
(58) Field of Classification Search ............... 365/154, 365/175
See application file for complete search history.

(56) References Cited

U.S. PATENT DOCUMENTS

| | | | | |
|---|---|---|---|---|
| 5,046,044 A | * | 9/1991 | Houston et al. | 365/156 |
| 6,128,216 A | * | 10/2000 | Noble et al. | 365/154 |
| 7,027,326 B1 | * | 4/2006 | Luk et al. | 365/175 |
| 7,038,938 B1 | * | 5/2006 | Kang | 365/154 |

* cited by examiner

*Primary Examiner*—Hoai V. Ho
(74) *Attorney, Agent, or Firm*—Ryan, Mason & Lewis, LLP

(57) ABSTRACT

A new type of static RAM cell is disclosed that is based on a gated diode and its voltage amplification characteristic. The cell combines the advantages of a static RAM, in which data refresh is not needed, and those of gated diode cells, which are scalable to low voltages, have high signal to noise ratio, high signal margin, and tolerance to process variations, to form a single high performance static memory cell. This new cell has independent read and write paths, which allow for separate optimization of the read (R) and write (W) events, and enable dual-port R/W operation. Furthermore, storage node disturbance during the read and write operations are eliminated, which greatly improves cell stability and scalability for future technologies.

24 Claims, 9 Drawing Sheets

STATIC RANDOM ACCESS MEMORY UTILIZING GATED DIODE TECHNOLOGY

FIELD OF THE INVENTION

The present invention relates to memory circuits and, more particularly, to memory circuits that utilize gated diode circuits.

BACKGROUND OF THE INVENTION

The small signal amplification characteristics of the gated diode device structure were originally used to create signal amplifiers and dynamic memory cells, including one transistor one diode (1T1D), two transistor one diode (2T1D), and three transistor one diode (3T1D) memory cells. U.S. patent application Ser. No. 10/735,061, entitled "Gated Diode Memory Cells," incorporated by reference herein, describes 1T1D and 2T1D gated diode memory cells, a new type of dynamic memory cell with internal voltage amplification based on gated diode circuits and structures. U.S. patent application Ser. No. 10/751,714, entitled "Amplifiers Using Gated Diodes," incorporated by reference herein, describes gated diode circuits for signal amplification that are suitable for amplifying small amplitude signals. U.S. patent application Ser. No. 10/751,713, entitled "3T1D Memory Cells Using Gated Diodes and Methods of Use Thereof," incorporated by reference herein, describes dynamic memory cells designed from gated diode circuits.

The gated diode memory cells in the above-identified patent applications are all dynamic designs in that data is retained in the storage node in the form of a unidirectional, single ended voltage and (capacitive) charge. The amount of charge stored eventually decays to a low level due to intrinsic leakage mechanisms, such as transistor off-state current, gate tunneling current, and junction leakage current. The low level charge is insufficient to maintain storage of the data. A "refresh" event is therefore needed (after a certain period of time) to bring the voltage or charge level back to its appropriate level in order to retain the stored data.

These previously proposed memory cells have a number of desirable characteristics, including low voltage operation, high signal to noise ratio, high signal margin, high tolerance to process and threshold voltage ($V_t$) variations, non-destructive read operation, fast read/write time, and short random access cycle. This allows for the continued scaling of memory for future technologies with lower supply voltages. Due to the signal amplification of the cell voltage of the gated diode memory cells, the memory cells can have a much higher signal margin than existing static random access memory (SRAM), dynamic random access memory (DRAM), and dynamic gain cells.

SRAM has traditionally been used for high performance applications, such as embedded caches in high performance processors, due to its fast read/write times, non-destructive read, short random access cycle, and static data storage (no refresh needed). As technologies are scaled to lower voltages, the static noise margin in the cross-coupled latch in the SRAM cell degrades (i.e., the signal margin or voltage difference between a 0- or 1-voltage and the flip point voltage becomes very small), especially during a read event, in which the internal storage node of the cell is perturbed. With the growing influence of process-induced variations, threshold voltage fluctuations further degrade the SRAM cell stability.

A need therefore exists for a memory device that does not require data refresh, but has the scalability to low voltages, high signal to noise ratio, high signal margin, and tolerance to process variations characteristic of gated diode dynamic memory cells.

SUMMARY OF THE INVENTION

A new type of static RAM cell is disclosed that is based on a gated diode and its voltage amplification characteristic. The cell combines the advantages of a static RAM, in which data refresh is not needed, and those of gated diode cells, which are scalable to low voltages, have a high signal to noise ratio, high signal margin, and tolerance to process variations, to form a single high performance static memory cell. This new cell has independent read and write paths, which allow for separate optimization of the two read/write (R/W) events and enable dual-port R/W operation. Furthermore, storage node disturbs during the read operation are eliminated, which greatly improves cell stability and scalability for future technologies.

A static gain cell is formed by combining a 4-transistor (4T) static latch and a 3-transistor (3T) gain cell with single-ended R/W ports (a total of 7 transistors). An alternative embodiment with only 6 transistors is also disclosed. The addition of a gated diode to the static gain cell, forming a static gated diode RAM cell, allows for amplification of the internal cell voltage during the read operation, which allows for the use of a very low supply voltage in the memory array while still achieving high performance, in terms of both read and write speed. The gated diode structure can be very simple as there are only loose restrictions on its electrical parameters (e.g., threshold voltage). A number of embodiments of the static gated diode RAM cell, with different circuit configurations and transistor counts, are disclosed, including a basic, minimal cell consisting of six transistors and a gated diode with separate read/write ports to a cell with eight transistors and a gated diode.

A more complete understanding of the present invention, as well as further features and advantages of the present invention, will be obtained by reference to the following detailed description and drawings.

DETAILED DESCRIPTION

A number of static random access memory (static RAM or SRAM) cells based on a gated diode are disclosed. Each static gated diode random access memory cell is comprised of a static storage element, such as a static latch, for holding the 0- and 1-data indefinitely (for as long as the power is ON), and a gated diode circuit for storing and amplifying the cell voltage during a read operation. The memory cells can perform a non-destructive read operation, do not require refresh, and can potentially become a replacement for conventional SRAM, such as 6T SRAM.

The read and write paths of the memory cell are single-ended and are independent of each other. As a result, the read and write operations can be individually optimized for speed and power. The memory cell can be structured as single- or dual-port, which can allow for concurrent read and write operations for cells in the same array with different addresses.

Due to the voltage amplification of the cell voltage by the gated diode, these memory cells can operate at a cell voltage that is about 50% of the supply voltage (VDD) used in traditional state of the art 6T SRAM cells. For traditional SRAM, the static noise margin decreases as supply voltage is lowered. These new memory cells show improved tolerance to process variations at lower supply voltages without degrading read/write speed, thus allowing for continued technology scaling.

The high voltage gain of the memory cell enables high read current and, hence, fast read and high performance. A low cell storage voltage also allows for low power and leakage. Furthermore, peripheral circuits such as word line drivers can be made smaller and faster since the traditional voltage boosting for read/write becomes unnecessary. With an optimized read path, the cell can likely be faster than traditional SRAM while operating at 50% of the supply voltage.

Pseudo-static variants with one less transistor are also disclosed. It is static when the cell stores a 1-data (which is generally considered much "harder" to hold than 0-data in dynamic memory), but only pseudo-static when the cell stores a 0-data—meaning its retention time can be made very long by properly designing transistor parameters such as sub-threshold, junction, and gate leakage currents.

Static RAM Cells with Independent Read/Write Paths

Figure 1:
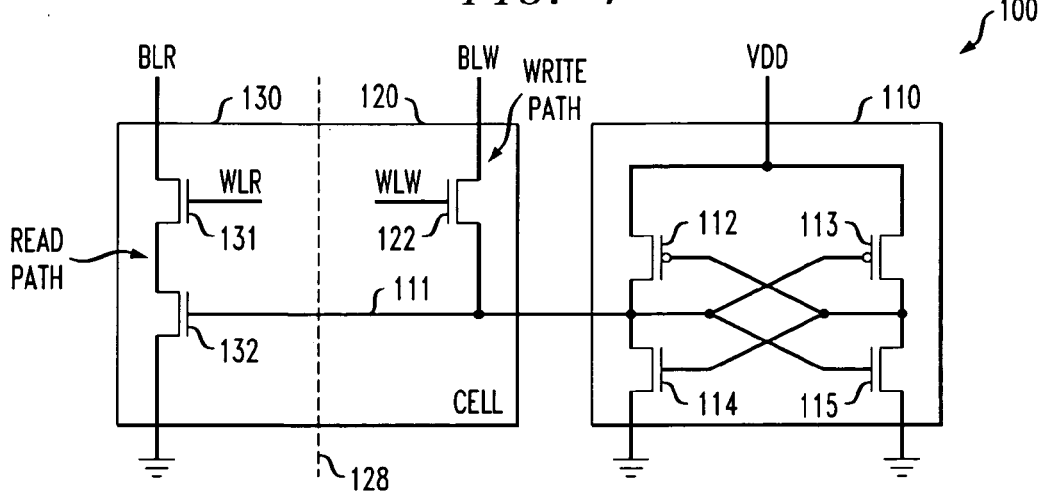
FIG. 1 shows a block diagram of a static RAM cell consisting of a static storage element and independent read and write paths.

FIG. 1 shows a block diagram of a static RAM cell 100 consisting of a static storage element and independent read/write paths. An embodiment of the static RAM cell 100 using a gain cell comprises a static storage latch 110 and a gain cell 128 which is comprised of a write path circuit 120 and a read path circuit 130. The memory cell 100 has distinct wordlines for read (WLR) and write (WLW), and also has distinct bitlines for read (BLR) and write (BLW), forming a two-port R/W memory cell. The two bitlines (BLW, BLR) can be combined into a single bitline for a single-port memory cell. Typically, to form an array of memory cells, the wordlines (WLR, WLW) connect the cells 100 in one direction, and the bitlines (BLW, BLR) connect the cells 100 in another direction (orthogonal to the wordlines) to an edge of a memory array. Input drivers drive input 0/1 signals into the cells 100 via the write bitlines (BLW) during a write operation, and sense amplifiers (not shown) detect the signals of the read bitlines (BLR) during a read operation.

Static Gain Cell RAM Cell

Figure 2:
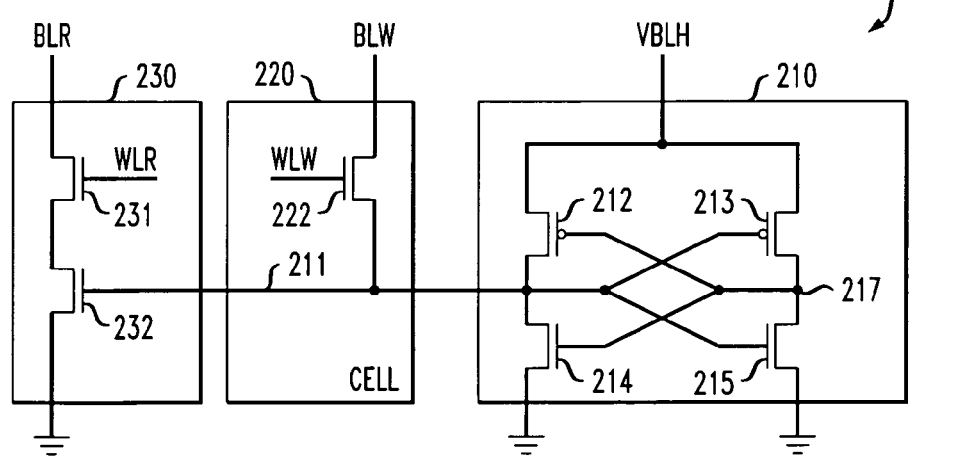
FIG. 2 shows a block diagram of an embodiment of the static RAM cell based on a gain cell.

FIG. 2 shows an implementation 200 of the static RAM cell 100 using a four-transistor cross-coupled latch 210 plus a one-transistor write path 220 and a two-transistor read path 230. The total transistor count is 7. The static storage circuit 210 can be a latch formed by two cross-coupled inverters (212/214 and 213/215). The write path circuit 220 consists of a transistor 222, gated by a write wordline (WLW), which couples the write bitline (BLW) and the storage node 211 of the memory cell 200 for writing into the storage node (CELL) 211. The read path circuit 230 consists of two stacked transistors 231, 232 with one end connected to GROUND and the other end connected to the read bitline (BLR). The read path circuit 230 detects the combined signals of the cell storage node 211 and the read wordline (WLR), which enables the cells 200 of a particular wordline address. Typically, the read bitline (BLR) is precharged to HIGH, and the difference in the ON and OFF current through the read path transistors 231, 232 (corresponding to a 1- or 0-data), will enable detection by a sense amplifier (not shown) connected to the read bitline (BLR).

In the memory cell 200 shown in FIG. 2, the cell high voltage is typically the supply voltage ($V_{DD}$) for a given technology. In order to write a high voltage into the storage node 211, the high voltage for wordline write (WLW) must be boosted above $V_{DD}$ to overcome the $V_t$ of the write transistor 222. A slightly negative low voltage can also be used to reduce the sub-threshold off current through transistor 222. Typically, the read bitline (BLR) is precharged to $V_{DD}$. During a read operation, the gate overdrive of the read path 230 is $V_{DD}-V_t$, which is a measure used to compare the read current and, hence, speed of the various memory cells disclosed.

Figure 3:
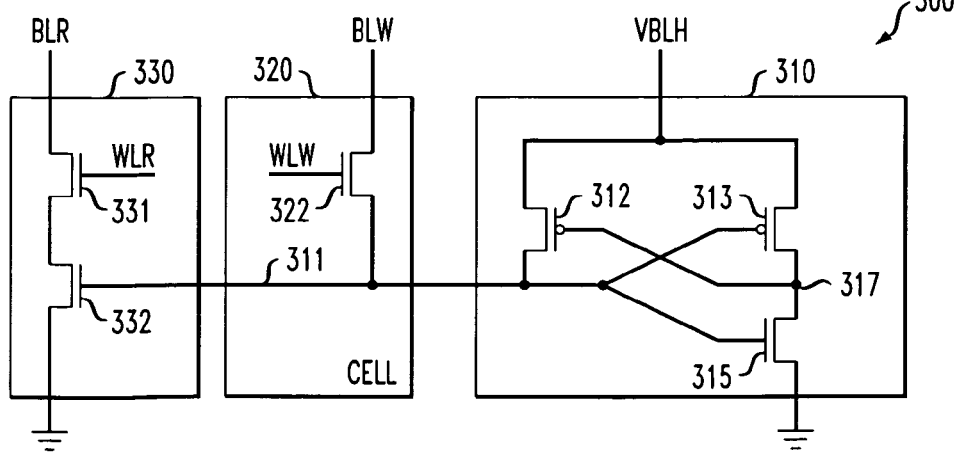
FIG. 3 shows a block diagram of a pseudo-static variant of the static RAM cell of FIG. 2 with one less transistor in the static latch.

FIG. 3 shows a pseudo-static variant of the static RAM cell 200 with one less transistor in the static latch 310. For 1-data, the three transistor latch 310 holds a high voltage at the storage node 311 indefinitely via the PFET 312, whose source and drain are connecting the storage node 311 to the supply rail and whose gate is held at GROUND by the complementary storage node 317. This is a half latch where, in the case of 0-data, the low voltage at the storage node 311 is not held down to GROUND by any ON transistor path. The storage node 311 is essentially floating and 0-data is dynamically-stored. There are, however, sub-threshold, junction, and gate leakage paths that can be designed to help maintain the data storage for 0-data.

For the traditional 6T cross-coupled SRAM, the corresponding storage nodes for 211, 217 and the two write/read access transistors are tightly coupled with each other. During a write/read operation, the voltage swing at the two bitlines and the voltage swing at the two storage nodes intertwine and can affect each other, leading to potential instability or false flipping if certain conditions of $V_t$ matching between the two symmetric sides of the 6T SRAM is not satisfied and the design margin is not met. Furthermore, the design margin is becoming more difficult to meet as the memory technologies are scaled. In contrast, the decoupled static storage nodes and the independent read/write paths of the static gain cell RAM 200 provide more stable operating conditions as the voltages at the storage nodes 211, 217 remain undistributed during the entire read, and the various voltages of the bitline (BLW) and the storage nodes are non-conflicting during write operations.

Static Gated Diode RAM Cells with Voltage Gain

A. 3T1D R/W Path Version

A gated diode can be incorporated into the static RAM cell(s) 100, 200, 300 to amplify the cell voltage, which results in a memory cell with the same functionality, but operating with at least 50% lower voltage. The details about the gated diode principle of operations, non-linear voltage boosting operation, and voltage gain characteristic are discussed in the three patent applications for amplifiers and dynamic memory cells mentioned earlier.

Figure 4:
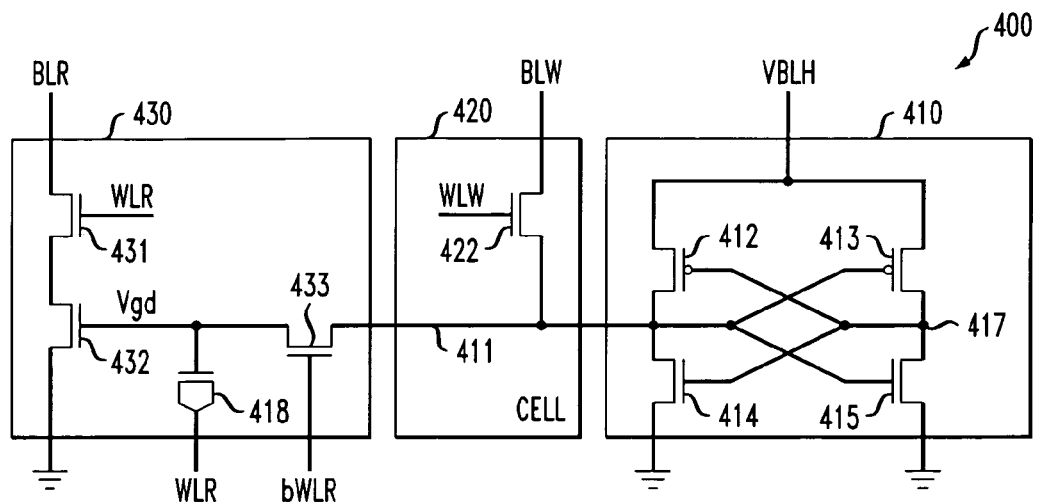
FIG. 4 shows a block diagram of a first embodiment of the static RAM cell using a gated diode, namely, a static gated diode RAM cell.

FIG. 4 shows a first embodiment of the static gated diode RAM cell 400. A gated diode 418 and a multiplexer 433 are added to the static RAM cell 200 of FIG. 2. The control gate of the multiplexer 433 is connected to bWLR (the complement of the read wordline WLR) which is high when the read operation is not active. The multiplexer 433 is therefore ON when the read operation is not active, thus connecting the storage node 411 of the static latch 410 to the gate of the gated diode 418. When a 1-data is stored (via the write access device 422 activated by the write wordline WLW) at the storage node 411, the high cell voltage is above the threshold voltage ($V_t$) of the gated diode 418. The gated diode 418 is thus ON with an inversion channel, so there is a significant ON capacitance (Cgs_gd(ON)) between the gate and the source of the gated diode 418. When a 0-data is stored at the storage node 411, the cell voltage is below the threshold voltage ($V_t$) of the gated diode 418. In this case, the gated diode 418 is OFF without an inversion channel, so there is only a small OFF capacitance (Cgs_gd(OFF)) between the gate and the source of the gated diode 418. The small capacitance is due to the parasitic capacitance between the gate node and the source node, and the difference or ratio between the ON capacitance Cgs_gd(ON) and the OFF capacitance Cgs_gd(OFF) can be made as large as needed by proper design.

The source of the gated diode 418 is connected to a read wordline (WLR); during a read operation, when cells 400 are selected by the wordline address, the voltage WLR is raised and the source voltage of the corresponding gated diode 418 of the same wordline address is raised. The multiplexer 433 is turned OFF as the wordline (WLR) is raised to isolate the gate node of the gated diode 418 from the storage node (CELL) 411. When 1-data is stored and the gated diode 418 is ON (as discussed above), significant capacitive coupling Cgs_gd(ON) between the source and the gate of the gated diode 418 boosts the voltage (Vgd) at the gate of the gate diode 418 to a few times (2 to 3 times for a typical design) of the pre-boosted voltage (which is the same as the cell voltage for 1-data). For 1-data, most of the inversion charge still remains in the gated diode 418 and the gated diode 418 remains ON during the read operation. For 0-data stored, the cell voltage is low or, typically, 0V. Since the gated diode 418 is OFF and the coupling capacitance Cgs_gd(OFF) between the source and the gate of the gated diode 418 is very small, the resulting voltage rise at the gate of the gated diode 418 is very small (typically, less than 5% of the Vgd high voltage). It becomes apparent that the read operation achieves a significant voltage difference between the two cases of 1- and 0-data. In other words, the difference in output voltage (Vgd_final) between 1- and 0-data is much higher (2–3 times) than the difference in the original stored voltage (at CELL or Vgd_initial). By adding the gated diode 418 to form the circuit 400 as described above, voltage amplification of the storage node voltage, with a typical gain of 2 to 3, can be achieved. This implies that a much smaller voltage can be stored in the memory cell 400—typically at least 50% of supply voltage for a given technology—while achieving the same level, or better, read current and speed during a read operation, as the gate overdrive voltage for the transistor(s) 431, 432 in the read path 430 can be retained at the same level (or better) to that of circuits 100, 200, 300 with a higher voltage, but without the gated diode 418.

As shown in FIG. 4, the static storage circuit 410 of the static gated diode RAM cell 400 can be a latch formed by two cross-coupled inverters (412/414 and 413/415). The write path circuit 420 consists of a transistor 422 gated by a write wordline (WLW) to couple between the write bitline (BLW) and the storage node 411 of the memory cell 400 for writing to the storage node (CELL) 411. The read path circuit 430 consists of two stacked transistors 431, 432 with one end connected to GROUND and the other end connected to the read bitline (BLR). The transistors 431, 432 detect the combined signals of the gated diode voltage (Vgd) and the read wordline (WLR), which enables the cells 400 of a particular wordline address. Typically, the bitline (BLR) is precharged to HIGH, and the difference in the ON and OFF current through the read path transistors 431, 432 (which corresponds to a 1- or 0-data) will enable detection by a sense amplifier connected to the bitline.

Let the cell or bitline high voltage be VBLH; typically, VBLH equals $V_{DD}/2$ when a gated diode 418 is used to amplify the cell voltage. The cell voltage for 1-data is VBLH and for 0-data is 0 V. In the circuit 400 shown in FIG. 4, the gate overdrive of the read path 430 is given by the smaller overdrive of the two transistors 431, 432 in the read path 430. The gate overdrive of the transistor 432 connected to detect the gated diode voltage (Vgd) is given by GAIN (VBLH)–$V_t$. The gate overdrive for the transistor 431 gated by WLR in the read path for read selection is $V_{DD}$–$V_t$. Typically, GAIN is between 2 and 3 and VBLH equals $V_{DD}/2$, so the overdrive is between $V_{DD}$–$V_t$ and 1.5 $V_{DD}$–$V_t$. The overall gate overdrive for the read path 430 is $V_{DD}$–$V_t$ and can be made as high as 1.5 $V_{DD}$–$V_t$ if a wider device for the read select transistor 431 is used, as a wider read select transistor is no longer limiting the current in the read path.

Operating at half the supply voltage $V_{DD}$, the memory cell 400 provides a better read current than the static RAM cells 200, 300 described earlier. Also, the overdrive voltage for read is higher than that of a typical 6T SRAM. Furthermore, the lower cell voltage of the static gated diode RAM cell 400 reduces power, enables simpler and smaller wordline drivers, and enhances write speed.

For a write operation, as a lower voltage is used to write to the storage node 411 via the write access transistor 422 (gated by a higher voltage), voltages corresponding to both the 1-data and 0-data can be written effectively into the storage node (CELL) with a fast write speed. Further, the decoupled static storage nodes 411, 417 and the independent read/write paths 430, 420 of the static gated diode RAM 400 provide more stable operating conditions as the voltages at the storage nodes 411, 417 remain undisturbed during the entire read operation, and the various voltages of the bitline (BLW) and the storage nodes are non-conflicting during write operations.

Figure 5:
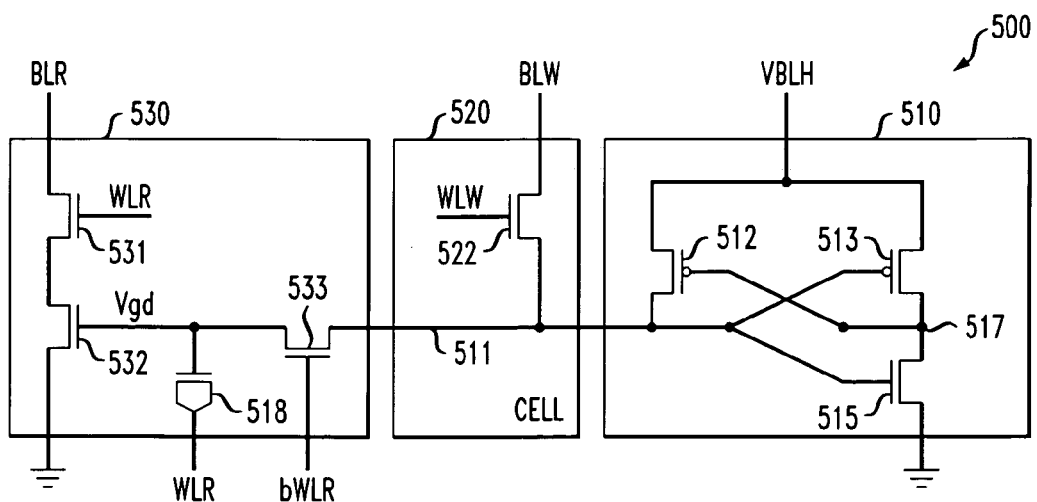
FIG. 5 shows a block diagram of a pseudo-static variant of the static gated diode RAM cell of FIG. 4 with one less transistor in the static latch.

FIG. 5 shows a block diagram of a pseudo-static variant of the static gated diode RAM cell 400 with one less transistor in the static latch 510. For 1-data, the three transistor latch 510 holds a high voltage at the storage node 511 indefinitely via the PFET 512, whose source and drain are connecting the storage node 511 to the supply rail and whose gate is held at GROUND by the complementary storage node 517. This is a half latch where, in the case of 0-data, the low voltage at the storage node 511 is not held down to GROUND by any ON transistor path. The storage is essentially floating and 0-data is dynamically-stored. There are, however, sub-threshold, junction, and gate leakage paths that can be designed to help maintain the data storage for 0-data.

B. 2T1D R/W Path Version

Figure 6:
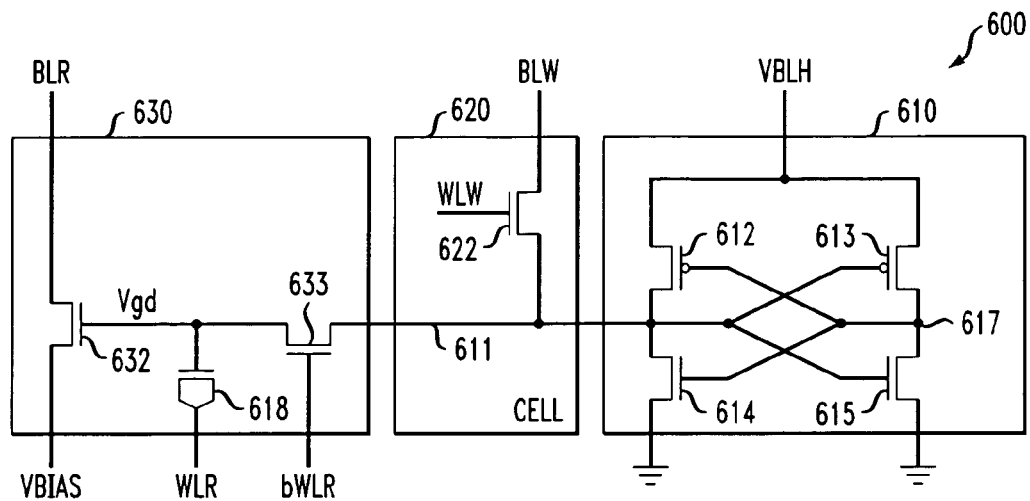
FIG. 6 is a block diagram of an alternative embodiment of the static gated diode RAM cell (2T1D R/W path version) of FIG. 4 using one less transistor in the read path.

FIG. 6 is a block diagram of an alternative embodiment of the static gated diode RAM cell (2T1D R/W path version) 400 using one less transistor in the read path 430. The gated diode amplification mechanism is the same as that described earlier for the 3T1D R/W path version 400, 500 (FIGS. 4 and 5).

In this embodiment, there is only one transistor 632 in the read path 630, which allows for direct detection of the gated diode voltage. The source of the transistor 632 is connected to a bias voltage (VBIAS), typically at VBLH. Since there is no read-select transistor as utilized in RAM cells 400, 500, the read path 630 can be turned OFF for all the non-selected cells 600 regardless of the voltage stored in the cell 600. To read the cell 600, the source of the gated diode 618 is boosted high via the read wordline (WLR). The amplified voltage at the gated diode 618 (Vgd) is detected by the read path transistor 632 and, in turn, an ON or OFF current is generated through the transistor 632 and the bitline (depending on whether a 1- or 0-data is stored, as detailed for the 3T1D R/W path version).

The cell 600 is written via the write path transistor 622 gated by the write wordline (WLW), as detailed for the 3T1D R/W path version 400, 500.

The gate overdrive for the cell variant 600 is given by GAIN(VBLH)–VBIAS–$V_t$. If VBIAS equals VBLH and VBLH equals $V_{DD}/2$, then the overdrive is $(GAIN–1)V_{DD}/2-V_t$. For GAIN=3, the overdrive equals $V_{DD}-V_t$, which is the same as the 3T1D R/W path version 400, 500 (typically). For example, the overdrive can be improved by using a higher gain gated diode design for the area saving obtained from one less transistor in the read path 630.

Figure 7:
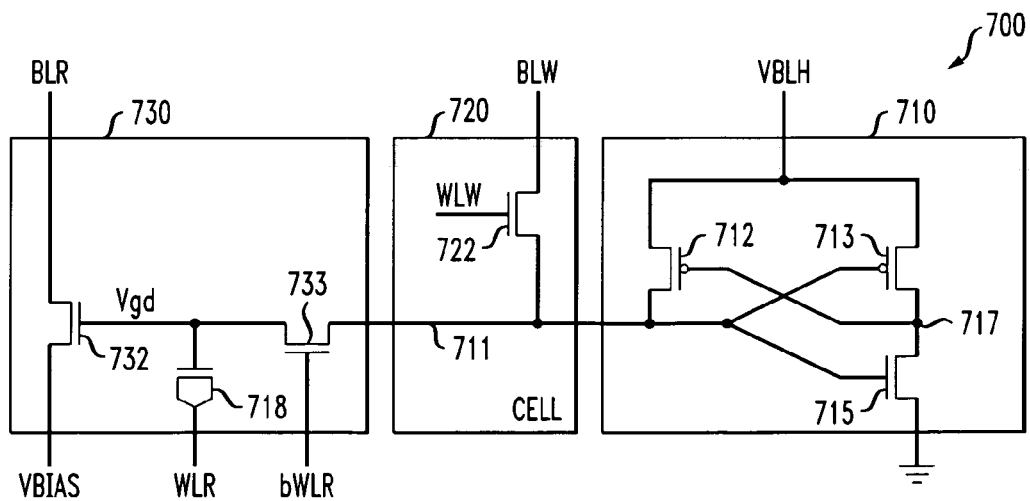
FIG. 7 shows a block diagram of a pseudo-static variant of the 2T1D R/W path version of the static gated diode RAM cell of FIG. 6.

FIG. 7 shows a block diagram of a pseudo-static variant of 2T1D R/W path version of the static gated diode RAM cell 600. The storage element 710 operates based on the same principle as the storage element 510 of the pseudo-static variant of 3T1D R/W path version 500 shown in FIG. 5.

C. Column Select for Array Implementation

Figure 8:
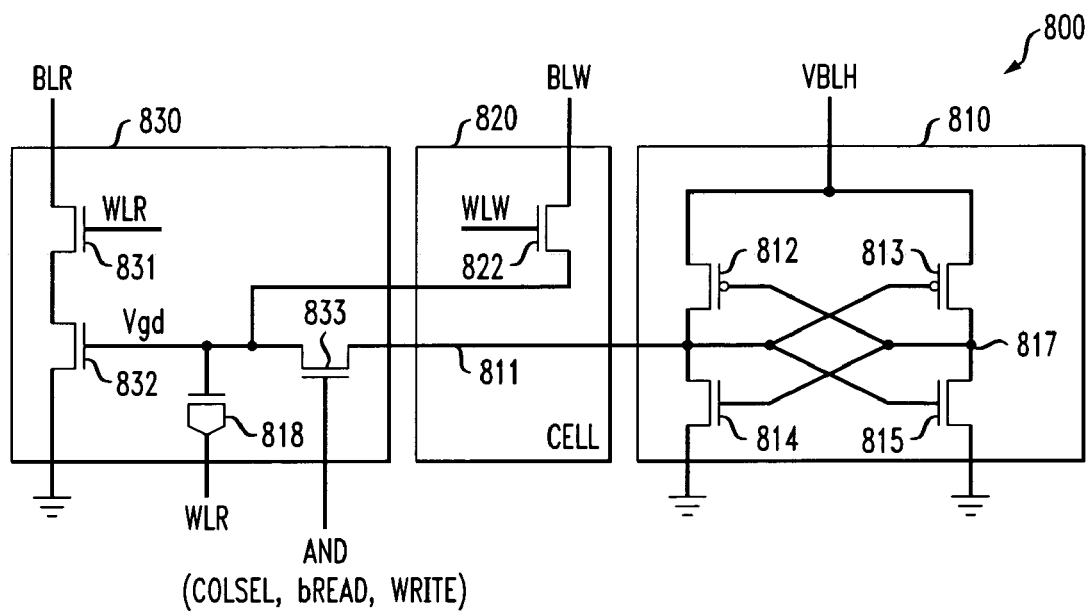
FIG. 8 is a block diagram of an alternative embodiment of the static gated diode RAM cell of FIG. 6 that utilizes a column select control signal.
Figure 9:
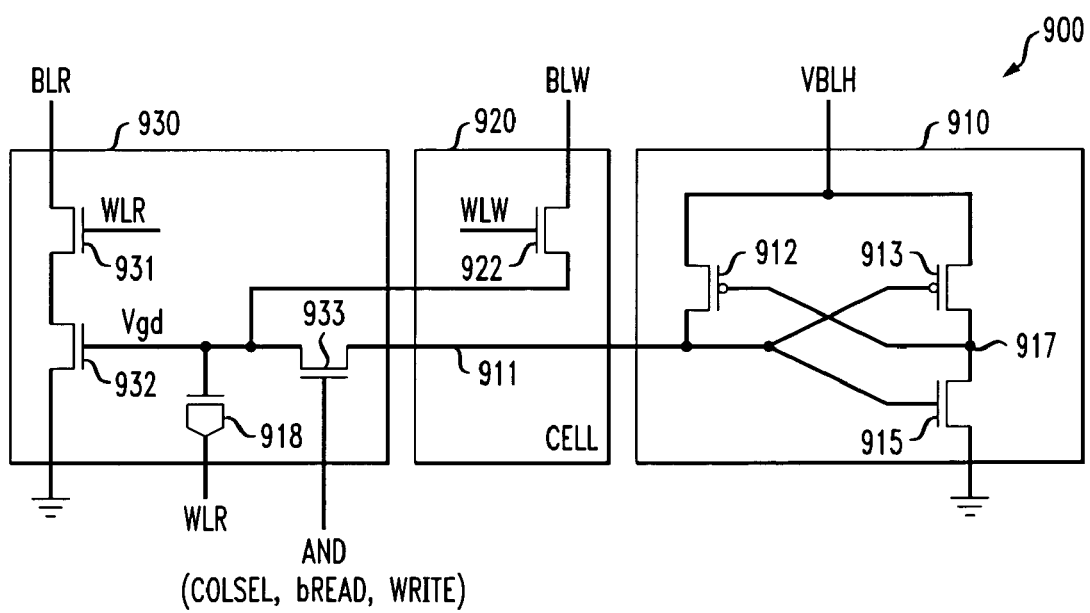
FIG. 9 shows a block diagram of a pseudo-static variant of the static gated diode RAM cell of FIG. 8.
Figure 10:
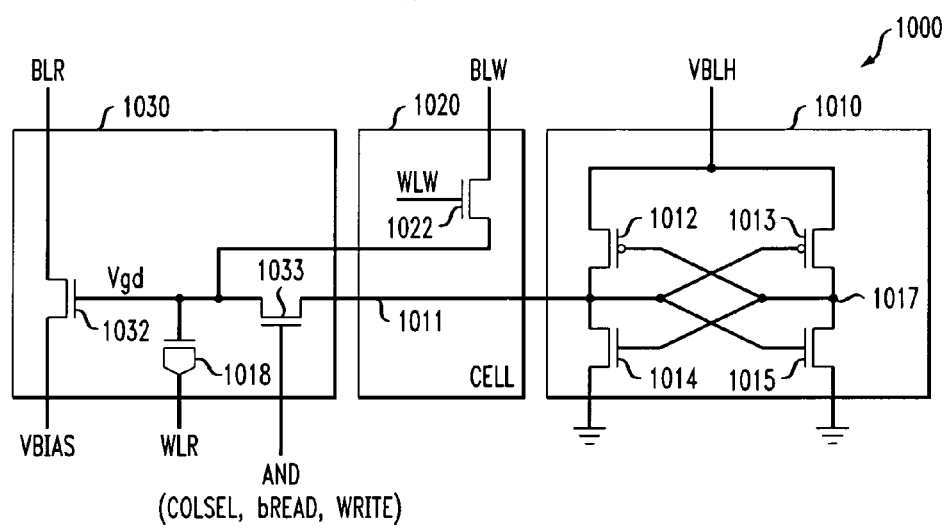
FIG. 10 is a block diagram of an alternative embodiment of the static gated diode RAM cell of FIG. 8 that utilizes a single transistor in the read path.
Figure 11:
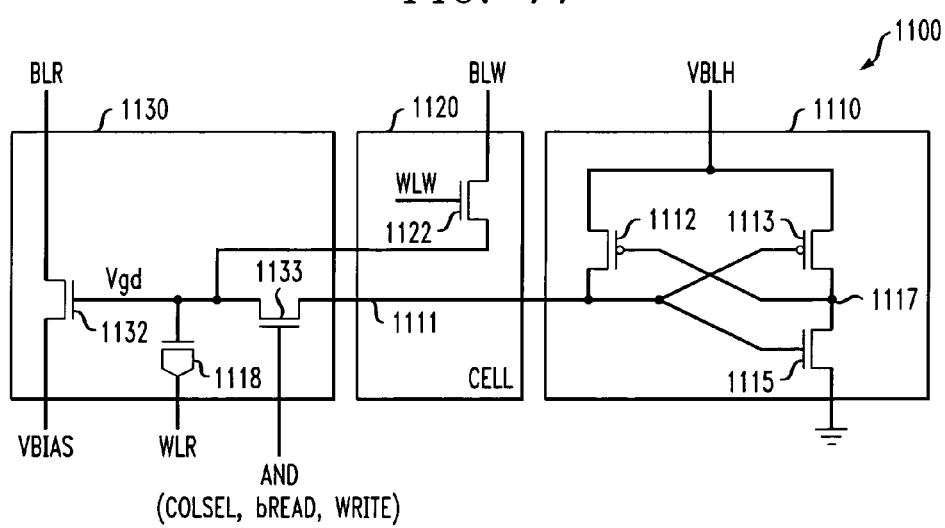
FIG. 11 shows a block diagram of a pseudo-static variant of the static gated diode RAM cell of FIG. 10.

For the write paths 420, 520, 620, 720 in the 3T1D R/W path version 400, 500 and in the 2T1D R/W path version 600, 700, data is directly written into the storage node 411, 511, 611, and 711, respectively, of the static storage element. It shall be understood that the write connection point can be connected to the other side of the multiplexer 433, 533, 633, 733 of the gated diode portion, since the multiplexer 433, 533, 633, 733 is ON during a write operation. This variation of the write path 830, 930 is shown in FIGS. 8 and 9 for the 3T1D R/W path versions, and in FIGS. 10 and 11 for the 2T1D R/W path versions. The latter way of connection for write can be used to configure the cells 800, 900, 1000, 1100 for column select (COLSEL) so that only a subset of cells 800, 900, 1000, 1100 on the same wordline (the same row in an array with same wordline address) are written. In some memory designs and applications, it is desirable to have only a subset of selected memory cells of a given row address to be written. COLSEL is generated based on the column address to select certain columns, and the COLSEL signals are typically running in the column direction orthogonal to the wordline direction (row direction). In order to do that, a control signal which is the AND operation of three controls signals (COLSEL, bREAD, WRITE; written as AND (COLSEL, bREAD, WRITE) is generated, where READ is a read enable control signal, WRITE is a write enable control signal, and bREAD is the complement of READ. The control signal AND(COLSEL, bREAD, WRITE) is applied to the gate of the multiplexer 833, 933, 1033, 1133, to select all the cells 800, 900, 1000, 1100 in a row for a read operation and some cells 800, 900, 1000, 1100 in certain columns of a row for a write operation. During a read, the multiplexers are off as bREAD equals 0. During a write (and not read), bREAD equals 1, WRITE equals 1, and the corresponding storage nodes (CELL) of those cells that are selected by COLSEL are written via the multiplexers 833, 933, 1033, 1133 through the write paths 820, 920, 1020, 1120.

D. 3T1D/2T1D R/W Path Versions with Simplified Control Signals

Figure 12:
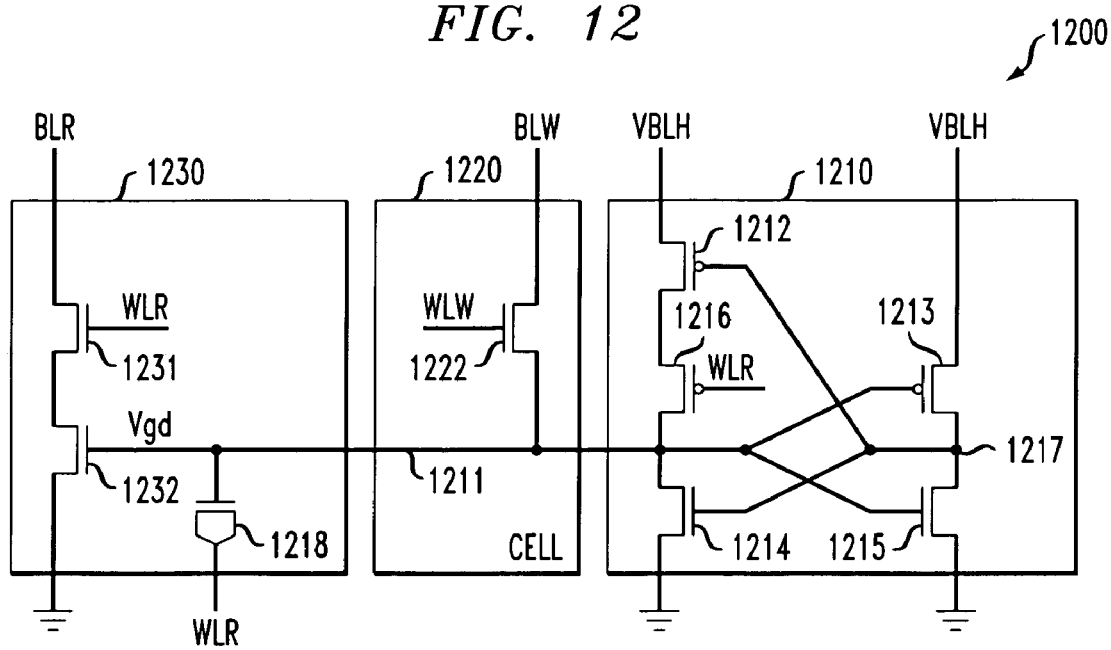
FIG. 12 is a block diagram of an alternative embodiment of the static gated diode RAM cell of FIG. 8 that eliminates the isolation device and adds a PFET in the storage latch, wherein one less control signal is required.
Figure 13:
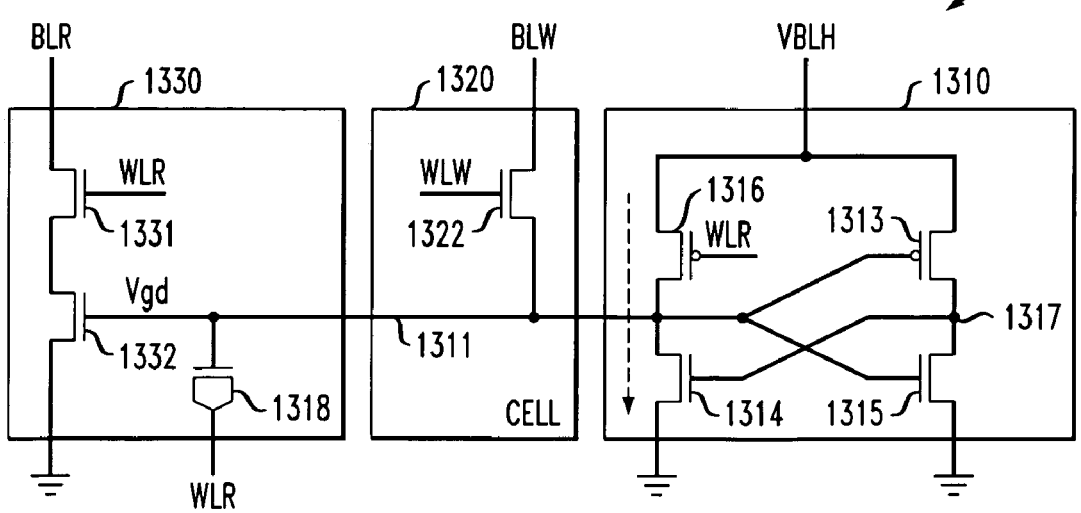
FIG. 13 is a block diagram of an alternative embodiment of the static gated diode RAM cell of FIG. 12, that eliminates the original PFET sourcing from $V_{DD}$.
Figure 14:
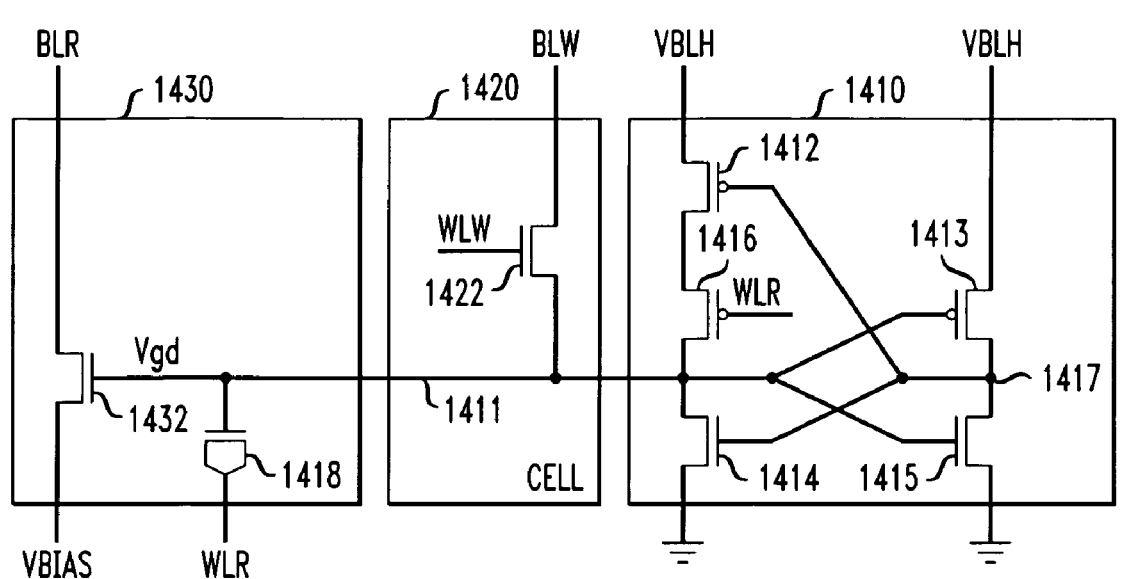
FIG. 14 is a block diagram of an alternative embodiment of the static gated diode RAM cell (2T1D R/W path version) of FIG. 12 using one less transistor in the read path.

FIGS. 12–15 show other embodiments of the static gated diode RAM cell 400, using 3T1D and 2T1D gated diode circuit configurations as the write paths 1220, 1320, 1420, 1520 and read paths 1230, 1330, 1430, 1530 for the static RAM 1200, 1300, 1400, 1500 which consist of 2 NFET's and 2 PFET's forming a cross couple storage element 1210, 1310, 1410, 1510. FIG. 12 is a block diagram of an alternative embodiment of the static gated diode RAM cell of FIG. 8 that eliminates the isolation device and adds a PFET in the storage latch. FIG. 14 is a block diagram of an alternative embodiment of the static gated diode RAM cell of FIG. 10 that eliminates the isolation device and adds a PFET in the storage latch. In the circuit configurations 1200, 1300, 1400, 1500, the control signal bWLR is not needed, so one less control signal is required which further simplifies the design.

In these configurations 1200, 1300, 1400, 1500, the gated diode 3T1D and 2T1D R/W circuits 1220/1230, 1320/1330, 1420/1430, 1520/1530 are connected directly to the storage node 1211, 1311, 1411, 1511 without the use of the NFET coupling device (or MUX) which is gated by a control signal bWLR, as shown in FIGS. 4–11. A PFET device 1216, 1416 which is gated by WLR is added to the static RAM storage 1210, 1410 so that the node (CELL) 1211, 1411 is isolated from the $V_{DD}$ supply path sourcing from the PFET 1212, 1412 above. Without the added PFET 1216, 1416, if the storage node "CELL" 1211, 1411 stores a 1, the original PFET sourcing the node "CELL" 1211, 1411 is ON and the node 1211, 1411 is coupled to $V_{DD}$ or a strong 1, and the node "CELL" 1211, 1411 cannot be boosted high. In the case of storing 0, the node "CELL" 1211, 1411 stays about 0, and the added PFET 1216, 1416 is also OFF and has no effect on the node "CELL" 1211, 1411. By adding the PFET 1216, 1416 gated by WLR, the node "CELL" 1211, 1411 is floating, free to be boosted high or remain low by the gated diode 1218, 1418 (in both the 3T1D or 2T1D R/W circuits) read boosting circuit during a read operation, regardless of whether the storage node 1210, 1410 stores a 1 or a 0, to achieve the high gated overdrive and read speed on the read path 1230, 1430 as illustrated in the previous read operation for the other circuits 430, 530, 630, 730, 830, 930, 1030, 1130. After read, WLR goes to 0 and the added PFET device 1216, 1416 is ON, forming a normal cross-couple storage element. During write operations, WLR stays 0 and the added PFET device 1216, 1416 is ON, forming a normal cross-couple storage element. In the circuits of FIGS. 12–15, the control signal bWLR (which is required for circuits shown in FIGS. 4–11) is not needed, and this further simplifies the overall memory design.

Figure 15:
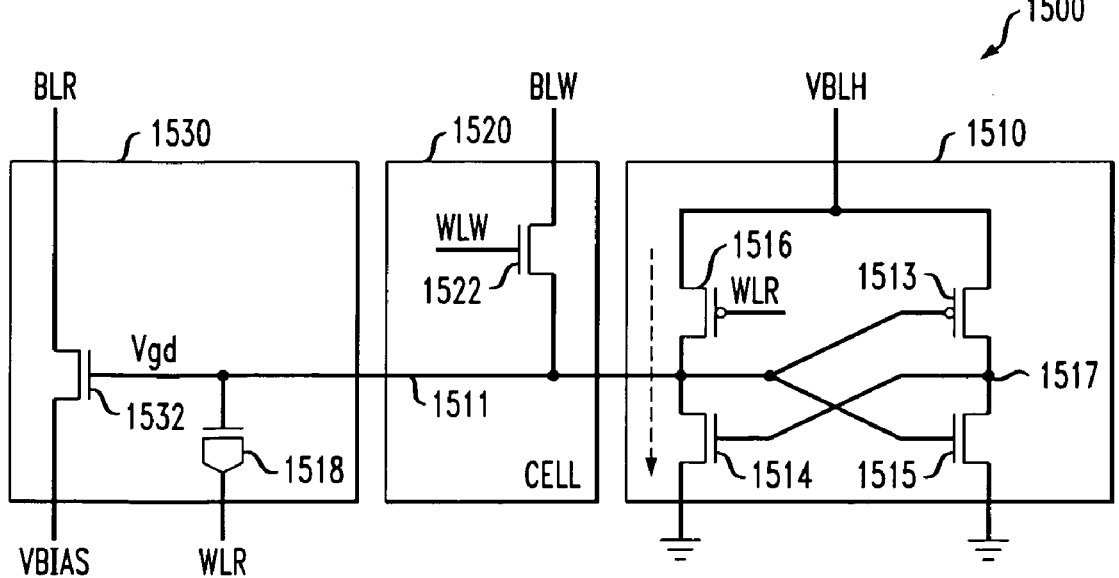
FIG. 15 is a block diagram of an alternative embodiment of the static gated diode RAM cell of FIG. 14 that eliminates the original PFET sourcing from $V_{DD}$.

FIGS. 13 and 15 show block diagrams of alternative embodiments of circuits 1200, 1400, respectively. FIG. 13 is a block diagram of an alternative embodiment of the static gated diode RAM cell of FIG. 12 that further eliminates the original PFET sourcing from $V_{DD}$. FIG. 15 is a block diagram of an alternative embodiment of the static gated diode RAM cell of FIG. 14 that further eliminates the original PFET sourcing from $V_{DD}$.

The circuits 1300, 1500 can function conceptually without the original PFET device 1212, 1412 sourcing from $V_{DD}$, with one less device per memory cell 1300, 1500, but with PFET 1216, 1416 added as described above. The drawback of such circuit configuration is that there is leakage current going through the added PFET 1316, 1516 when the cell stores a 0 during hold time, as PFET 1316, 1516 is ON, unless there is an improved way to control such leakage, e.g. by power gating the $V_{DD}$ supply line connected to the memory storage elements 1310, 1510.

It shall be understood that the control signal bWLR used to control the multiplexers 433, 533, 633, 733 of the circuit configurations as described in FIGS. 4, 5, 6, and 7 can be replaced by another control signal bREAD which is the complement of a read enable signal READ. READ equals 1 and bREAD equals 0 during a read operation, hence the multiplexers can be turned off during read and the gate voltage (Vgd) of the gated diode 418, 518, 618, 718 can be boosted (for 1-data) as described previously for the embodiments of FIGS. 4, 5, 6, and 7 to obtain high current drive. The control signals READ, bREAD are independent of the wordline address and are global signals that typically run in the column direction orthogonal to the wordline direction (or row direction).

Figure 16:
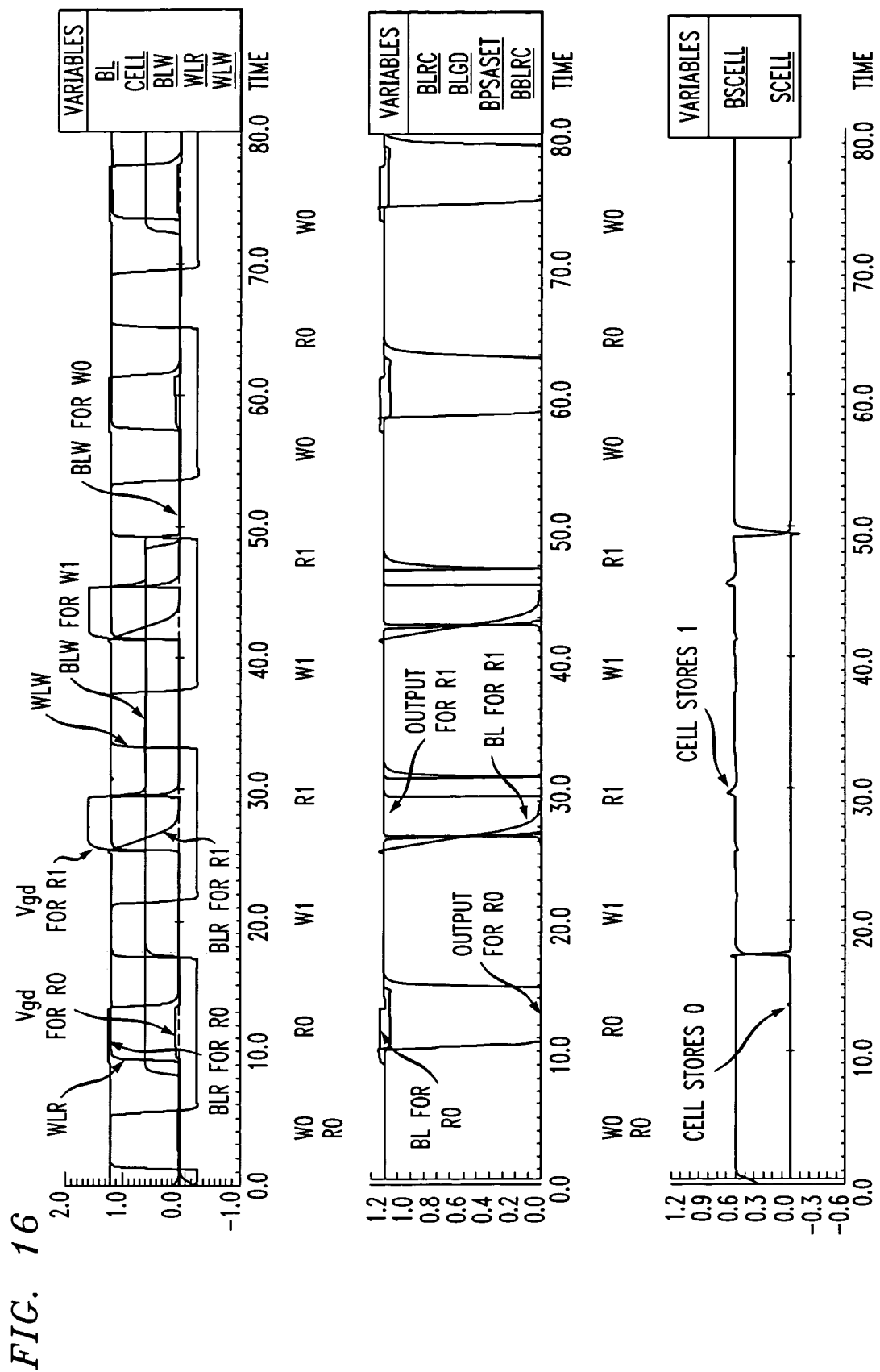
FIG. 16 shows the functional waveforms for the static gated diode RAM cell of FIG. 4.
Figure 17:
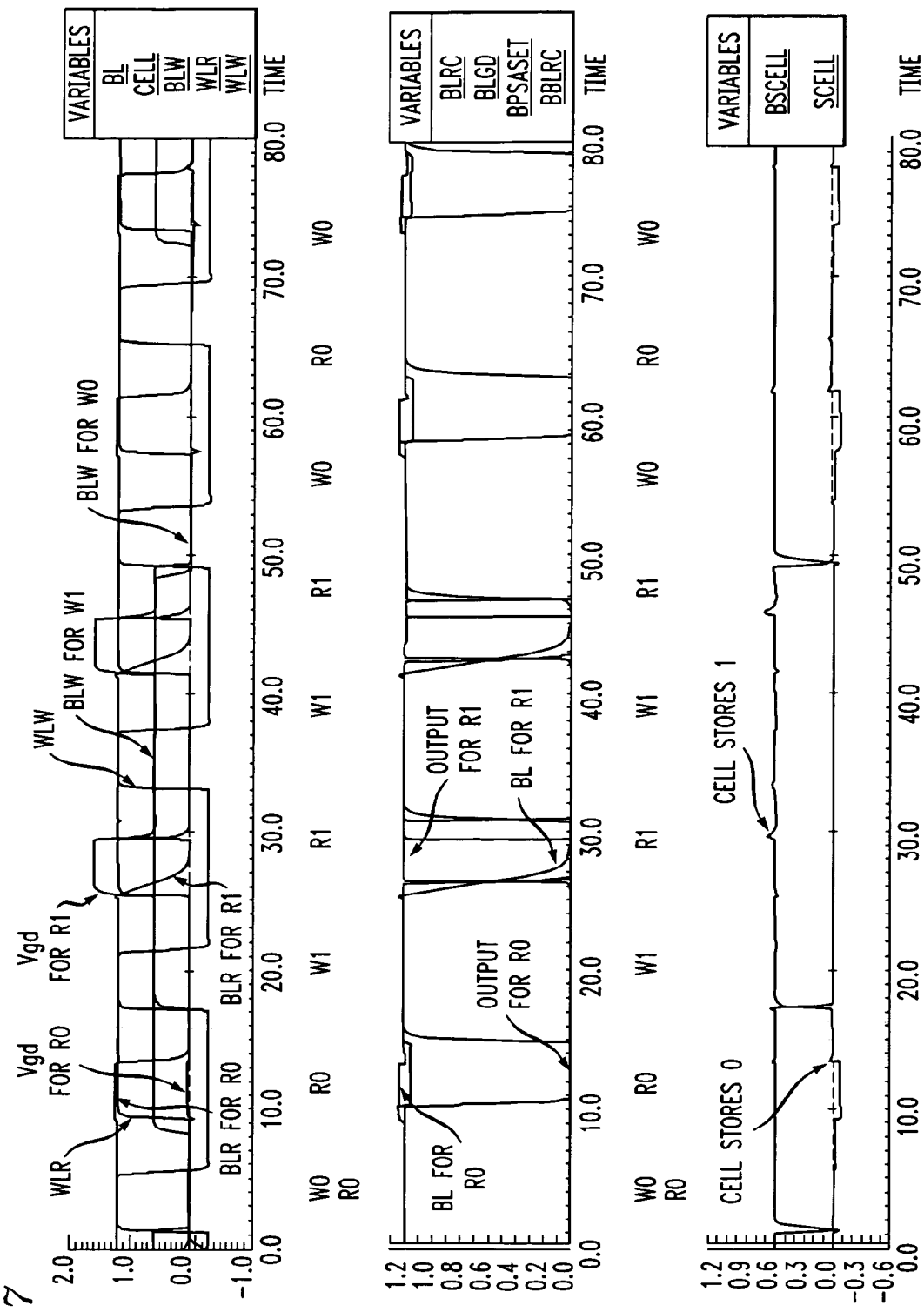
FIG. 17 shows the functional waveforms for the pseudo-static gated diode RAM cell of FIG. 5.

The functional waveforms of the voltages at key circuit nodes of the static gated diode RAM cells of embodiments 400 and 500 are shown in FIG. 16 and FIG. 17 to further illustrate the operations and results of the circuits. In both FIG. 16 and FIG. 17, W0 and W1 represent the write 0-data operation and write 1-data operation to a memory cell, respectively, and R0 and R1 represent the read 0-data operation and read 1-data operation from a memory cell, respectively. A sequence of write and read operations on a memory cell is shown, namely, W0, R0, W1, R1, W1, R1, W0, R0, W0, R0. The top portion shows the voltage waveforms of WLW, WLR, BLW, BLR, Vgd (the gated diode gate voltage) under such sequences of write and read operations of 0-data and 1-data. The middle portion of FIG. 16 and FIG. 17 show the output waveforms of the memory cells after detection by a typical single ended sense amplifier (not detailed in this disclosure). The lower portion of FIG. 16 and FIG. 17 show the cell voltage (CELL) of the static storage elements.

For example, during the first W0 operation, WLW is activated, 0-data (0 V) is written into the cell via BLW. The cell voltage (CELL) stores 0 V. Then it is followed by the R0 operation, WLR is activated, Vgd stays almost at 0 V and BLR stays high. The output of the memory cell stays low (0 V) (middle portion). The cell voltage (CELL) remains at 0 V during W0 and R0 (lower portion). Then it is followed by a W1 operation, wherein WLW is activated, and 1-data which corresponds to a voltage (VBLH), typically 50% of the supply voltage (VDD) of a given technology, is written into the cell via BLW. The cell voltage (CELL) stores VBLH. Then it is followed by a R1 operation, wherein WLR is activated, Vgd is boosted to a high voltage of about 1.3 VDD, achieving a gain of about 2.6, giving high current drive for reading the 1-data, as shown by discharging the high voltage of BLR to low. As a result, the output of the memory cell switches to high (middle portion). The cell voltage (CELL) remains high (VBLH=VDD/2) during W1 and R1 (lower portion). In the pseudo-static gated diode RAM cell of 500, with waveforms shown in FIG. 17, which are very similar to that of FIG. 16 of the static gated diode RAM cell 400, except that the CELL voltage is floating during the storing of a 0-data, and such effect can be observed in the 0-data stored waveform (lower portion). These four operations of W0, R0, W1, R1 illustrate the basic concept and working of the two memory cell embodiments 400 and 500. The functional waveforms and workings of the other memory cell embodiments can be illustrated and understood in a similar fashion.

It is to be understood that the embodiments and variations shown and described herein are merely illustrative of the principles of this invention and that various modifications may be implemented by those skilled in the art without departing from the scope and spirit of the invention.

We claim:

1. A static RAM cell, comprising:
   a static latch;
   a gated diode; and
   an isolation device, wherein a first port of said isolation device is connected to a port of said static latch and wherein a second port of said isolation device is connected to a gate of said gated diode.

2. The static RAM cell of claim 1, further comprising a write circuit connected to said port of said static latch.

3. The static RAM cell of claim 2, wherein said write circuit comprises a field-effect transistor, wherein a drain of said field-effect transistor is connected to a write bitline, wherein a gate of said field-effect transistor is connected to a write wordline, and wherein a source of said field-effect transistor is connected to a port of said isolation device.

4. The static RAM cell of claim 2, wherein said write circuit has an input port connected to a write bitline and a control port connected to a write wordline.

5. The static RAM cell of claim 1, further comprising a write circuit connected to said gate of said gated diode.

6. The static RAM cell of claim 5, wherein said write circuit comprises a field-effect transistor, wherein a drain of said field-effect transistor is connected to a write bitline, wherein a gate of said field-effect transistor is connected to a write wordline, and wherein a source of said field-effect transistor is connected to a port of said isolation device.

7. The static RAM cell of claim 5, wherein said write circuit has an input port connected to a write bitline and a control port connected to a write wordline.

8. The static RAM cell of claim 1, further comprising a read circuit connected to said gate of said gated diode.

9. The static RAM cell of claim 8, wherein said read circuit comprises a first transistor and a second transistor, wherein said first and second transistors are connected serially, wherein said gate of said gated diode is connected to said read circuit via a gate of said first transistor, wherein a source of said first transistor is connected to a voltage, wherein a gate of said second transistor is connected to a read control wordline, and wherein a drain of said second transistor is connected to a read data bitline.

10. The static RAM cell of claim 8, wherein said read circuit comprises a first transistor, wherein said gate of said gated diode is connected to said read circuit via a gate of said first transistor, wherein a source of said first transistor is connected to a voltage, and wherein a drain of said first transistor is connected to a read data bitline.

11. The static RAM cell of claim 1, wherein a voltage applied to a source of said gated diode is adjusted in said read mode.

12. The static RAM cell of claim 1, wherein said isolation device is on during a write mode.

13. The static RAM cell of claim 1, wherein said static latch stores a zero logic level in a pseudo-static manner.

14. The static RAM cell of claim 1, wherein switching of said isolation device is based on a wordline read control signal.

15. The static RAM cell of claim 1, wherein switching of said isolation device is based on a read control signal, a write control signal and a column select control signal.

16. The static RAM cell of claim 1, wherein said isolation device is a field-effect transistor.

17. The static RAM cell of claim 1, wherein said isolation device connects said port of said static latch to said gate of said gated diode when a read mode is inactive and isolates said port of said static latch from said gate of said gated diode when said read mode is active.

18. A static RAM cell, comprising:
a static latch; and
a gated diode, wherein a gate of said gated diode is connected to a port of said static latch, and wherein said port of said static latch is floating during a read operation.

19. A method of reading from a memory cell, comprising the steps of:
applying an output signal of a static latch to a gate of a gated diode; and
applying a read control signal to a source of said gated diode.

20. The method of claim 19, further comprising the step of isolating said output signal from said gate of said gated diode in a read mode.

21. The method of claim 19, wherein said read control signal is a read wordline control signal.

22. The method of claim 19, wherein a read bitline data signal receives a read data signal from said gate of said gated diode during a read operation.

23. A memory array, comprising a plurality of static RAM cells, wherein each RAM cell comprises:
a static latch;
a gated diode; and
an isolation device, wherein a first port of said isolation device is connected to a port of said static latch and wherein a second port of said isolation device is connected to a gate of said gated diode, and wherein said isolation device connects said port of said static latch to said gate of said gated diode when a read mode is inactive and isolates said port of said static latch from said gate of said gated diode when said read mode is active.

24. A memory array, comprising a plurality of static RAM cells, wherein each RAM cell comprises:
a static latch; and
a gated diode, wherein a gate of said gated diode is connected to a port of said static latch, and wherein said port of said static latch is floating during a read operation.

* * * * *